United States Patent [19]

Wamstad

[11] 4,399,707

[45] Aug. 23, 1983

[54] STRESS SENSITIVE SEMICONDUCTOR UNIT AND HOUSING MEANS THEREFOR

[75] Inventor: David B. Wamstad, Roseville, Minn.

[73] Assignee: Honeywell, Inc., Minneapolis, Minn.

[21] Appl. No.: 231,546

[22] Filed: Feb. 4, 1981

[51] Int. Cl.³ .............................................. G01L 9/06
[52] U.S. Cl. .................................. 73/727; 73/721;
73/DIG. 4; 338/4; 338/42
[58] Field of Search ............... 73/720, 721, 726, 727,
73/708, 756, DIG. 4; 338/4, 3, 42

[56] References Cited

U.S. PATENT DOCUMENTS

| | | | |
|---|---|---|---|
| 3,753,196 | 8/1973 | Kurtz et al. | 338/4 |
| 3,793,064 | 2/1974 | Budd et al. | 117/217 |
| 3,941,916 | 3/1976 | Morse | 29/626 |
| 3,943,557 | 3/1976 | Frazee et al. | 338/35 |
| 4,008,945 | 2/1977 | Scherer | 350/1 |
| 4,079,508 | 3/1978 | Nunn | 29/580 |
| 4,127,840 | 11/1978 | House | 338/4 |
| 4,131,911 | 12/1978 | Fujine | 357/74 |
| 4,172,261 | 10/1979 | Tsuzuki et al. | 357/81 |
| 4,178,529 | 12/1979 | Kennedy | 313/102 |
| 4,276,533 | 6/1981 | Tominaga et al. | 73/727 |
| 4,303,903 | 12/1981 | Matsuoka et al. | 338/4 |
| 4,314,225 | 2/1982 | Tominaga et al. | 73/721 |
| 4,321,578 | 3/1982 | Nagasu et al. | 73/721 |

Primary Examiner—Donald O. Woodiel
Attorney, Agent, or Firm—R. W. Jensen; S. W. Buckingham

[57] ABSTRACT

A stress sensitive semiconductor die and housing means therefore comprising a ceramic base member having a recessed portion and a shoulder portion around the periphery. A washer-like support member is positioned within the recess, one face of which is bonded to the base member, said support member having a central aperture. A stress sensitive semiconductor die is bonded to the other face of the support member with the center of the die being in substantial register with the aperture in the support member. Finally, cover means are attached to the shoulder portion.

11 Claims, 4 Drawing Figures

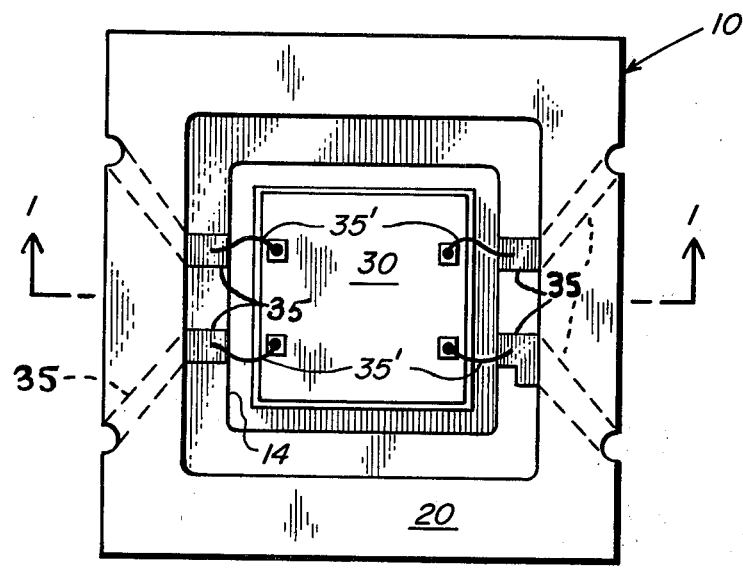
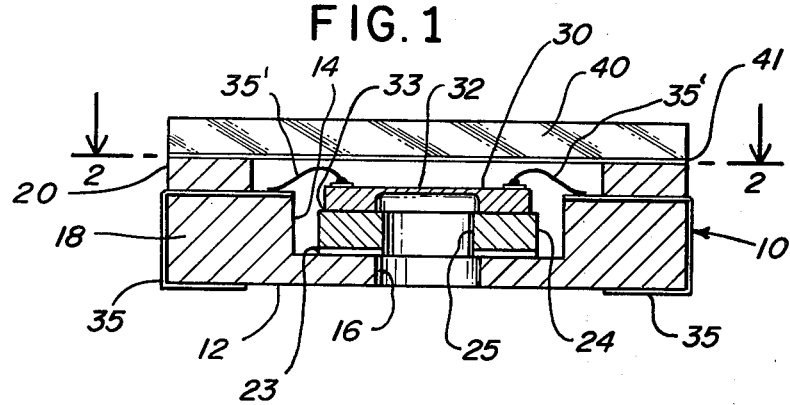
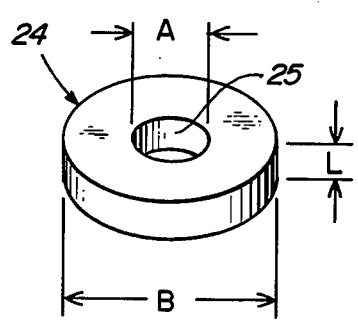
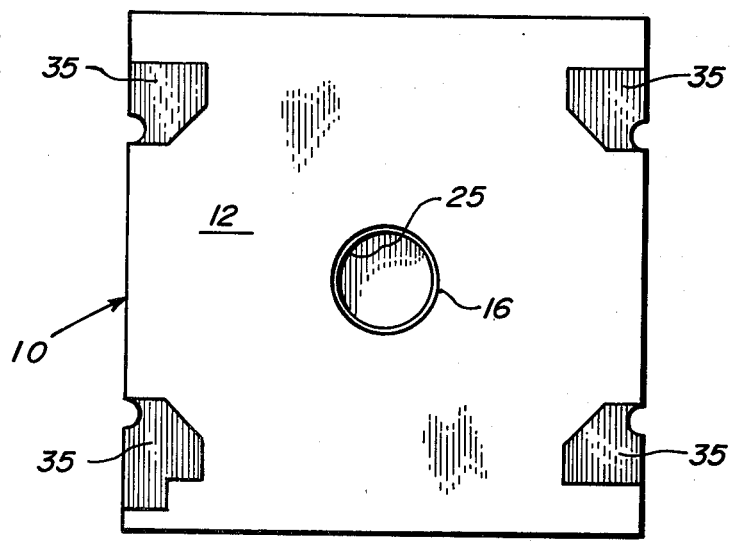

STRESS SENSITIVE SEMICONDUCTOR UNIT AND HOUSING MEANS THEREFOR

BRIEF SUMMARY OF THE INVENTION

The subject invention comprises a stress sensitive semiconductor unit and housing means therefor and has special applicability to the field of pressure transducers. Broadly speaking the stress sensitive semiconductor unit and housing means therefor comprises a ceramic base member having a recessed portion with a shoulder portion projecting upwardly and around the periphery of said recessed portion. Positioned in the recess is a cylindrical support member mounted on one face thereof to the base member. A stress sensitive semiconductor die is mounted on the other face of the support member; the die is bonded to the support member and is positioned so that the die center is substantially in register with the central axis of the support member. After the die is mounted on the support member, then a cover means is attached to or bonded to the shoulder portion. The above described support of the die by the support member functions to substantially isolate the die from external stresses transmitted by said base member.

In the case of a pressure transducer the base member and the support member both have central apertures in register with one another; further the die (which may be of the piezoresistive type) has a diaphragm portion which is positioned in register with said apertures. For this case, the ratio of the inside diameter of the aperture in the support member to the outside diameter of the support member has significance as does the ratio between the length of the die and the diameter of the support member.

BRIEF DESCRIPTION OF THE DRAWINGS

FIG. 1 is a cross-section view of an integrated piezoresistive pressure transducer comprising the preferred embodiment of my invention;

FIG. 2 is a top view of the device shown in FIG. 1 along the section line 2—2;

FIG. 3 is a bottom view of the device shown in FIG. 1; and

FIG. 4 is an isometric view of a washer-like support member for mounting the stress sensitive semiconductor die within the housing or on the ceramic base member.

DESCRIPTION OF THE PREFERRED EMBODIMENT

Referring to FIG. 1 the reference numeral 10 is intended to designate the entire stress sensitive semiconductor unit and housing means therefore, the preferred embodiment depicted being an integrated piezoresistive pressure transducer adapted to measure absolute pressure.

The housing means for the semiconductor unit or die comprises a ceramic base member 12 having a rather deep square-shaped recess or recessed portion 14 with a central aperture or passageway 16 therethrough, and with a main shoulder portion 18 being defined around the periphery of the recess 14. A square shaped ring 20 also made of ceramic (and preferably integral with shoulder 18) constitutes a further extension of the shoulder. A preferred material for housing or base member 12 is 3M Company ALSIMAG771, a 94% $Al_2O_3$ Alumina Ceramic. The 3M Company supplies complete housing units of various configurations. This specific ceramic has a coefficient of temperature expansion of $6.0 \times 10^{-6}$ in/in/°C. This ceramic is especially appropriate for an absolute pressure transducer because of is extremely low leak rate and low outgassing rate.

A washer-like support member 24 is positioned within the recess 14 and is hermetically bonded on one face thereof to the bottom of the recess of the ceramic base member. Support member 24 is shown in more detail in FIG. 4 and it will be noted that it has a washer-like shape, i.e., with a centrally located hold or aperture 25. In FIG. 4 the inside diameter of the support member, i.e., the diameter of the aperture 25 has the designator A, the outside diameter of the support member has a designator B, and the axial Length of the washer has the designator L. Support member 24 is made of a suitable borosilicate glass such as Corning Glass Company type 7740 sold under Trademark "Pyrex," or Corning types 7720 or 3320 glass; further 24 could be of silicon. Pyrex glass used in my invention has a coefficient of temperature expansion of $3.25 \times 10^{-6}$ in/in/°C.

It will be noted from FIG. 1 that the washer 24 is positioned so that the aperture 25 thereof is substantially in register with the aperture 16 in the base member 12.

Mounted on top of the support member 24, is a silicon die 30 having a central portion of substantially reduced thickness 32, the die being bonded to the support member 24 so as to hermetically seal the die to the support member and to position the said portion of reduced thickness in register with apertures 25 and 16. The central portion 32 has disposed thereon piezoresistive means (not shown) of a type well known to those skilled in the art to sense flexing of the disphragm-like portion 32 in response to a differential in fluid pressure on opposite sides thereof and to develop electrical signals (change in resistance) as a function of such flexing, i.e., pressure differentials.

Die 30, in the preferred embodiment, is made from a silicon material having a room temperature coefficient of thermal expansion of $2.3 \times 10^{-6}$ in/in/°C. and a "Bonding Temperature" coefficient of thermal expansion of $4.2 \times 10^{-6}$ in/in/°C., i.e., the average coefficient of thermal expansion is substantially identical to that of the Pyrex support member 24; the foregoing temperature coefficients being typical of many silicon materials currently utilized in the semiconductor industry.

A plurality of metal connectors 35 are provided integral with the ceramic base member 12. Referring to FIGS. 1, 2, and 3, leads 35 are shown on the top surface of shoulder portion 18, the leads extending through the base member and continued down along the side surface thereof to the underside or bottom of the base member as is depicted in FIG. 3 so that a means is provided of connecting the transducer electrically to the next assembly, now shown. A plurality of leads 35' (see FIGS. 1 and 2) connect from the exposed surfaces of connectors 35 on the top of shoulder 18 to the circuitry, e.g., semiconductor, integrated, and/or piezoresistive (not shown) on the top surface of the die 30. Leads 35' are connected subsequent to the bonding of (i) die 30 to support member 24 and (ii) support member 24 to base 12 and prior to the bonding of cover 40 to the ceramic base member.

A cover member 40 made of glass or ceramic or other appropriate material, is positioned to abut against the top surface shoulder portion 20 and is hermetically sealed thereto. In the case of the preferred embodiment, i.e., a piezoresistive pressure transducer used as an absolute pressure transducer then the space or volume enclosed by the cover 40 is evacuated down to a hard vacuum prior to the hermetic sealing of the cover 40 to the shoulder 20 to thus establish a vacuum reference for the absolute pressure transducer. The apertures 16 and 25 are adapted to be connected to a pressure port, i.e., a pipe or the equivalent containing a fluid, the pressure of which is desired to be measured. Thus with a vacuum on one side of the portion 32 of the silicon die and with a positive pressure on the other side, it follows that the portion 32 will be flexed as a function of the differential in pressure. Such flexing in turn will produce an output signal in the piezoresistive means deposited on the face thereof in the manner known well to those skilled in the art.

The cover 40 may be transparent to the visible light frequencies so as to permit visual control of laser trimming of trimmable resistors (not shown) deposited on the face of the die 30.

It will be appreciated that for an absolute pressure transducer it is essential to have hermetic seals between base member 12 and support member 24, between support member 24 and silicon die 30, between shoulder 18 and extension 20, and between extension 20 and the cover 40. The hermetic seals have several purposes. First, the seals provide or permit a vacuum reference for an absolute pressure transducer. Secondly, the seals provide environmental protection for the active or circuit side of the die 30. Further, the seals are fabricated using selected material so as to provide a rigid seal between washer support member 24 and base member 12 and between die 30 and support member 24; the rigid seal being a requirement for transducer performance to minimize pressure hysteresis and temperature hysteresis and also to permit transducer repeatability. Further, the hermetic seals provide for transducer stability over a period of time; the hermeticity leak rate and out gasing rate determines transducer output shift as a function of time. To meet the absolute transducer requirements, the vacuum reference leak rate and out gasing rate must not exceed $2.37 \times 10^{-13}$ cc/second air equivalent at standard conditions of pressure and temperature.

The specific type of hermetic seals utilized in the preferred embodiment of the present invention to provide the seals between the die 30, washer support member 24, and base member 12, must be of the rigid type capable of high temperature processing, to minimize out gasing of the vacuum reference and to provide a stable amount for the transducer die. One of the materials suitable of this application is gold germanium (eutectic temperature of 356° C.). The hermetic seal 41 between the cover 40 and ceramic shoulder ring 20 must be a high temperature seal to minimize out gasing; this seal must be a lower temperature seal than that between the washing support member 24 and die 30. This is required to facilitate the assembly sequence and to establish the vacuum reference. One of the materials suitable for this application is lead/tin/silver (eutectic temperature of 309° C.) with a bonding temperature of approximately 330° C. The hermetic seals at joint 23 and at joint 41 are preferably made using well known spring biased high temperature bonding techniques with spring loading of approximately 30-35 psi and 20-30 psi respectively. 350° C.

To bond the die 30 to the washer support 24, the preferred process is to bring both of said parts up to a temperature of approximately 350°-500° C., then apply a 1000 volt DC electric potential across the parts so as to develop an electrostatic bonding process, a process well known to those skilled in the art. Thus, in the sequence of bonding the assembly together, the first step is to bond die 30 to the Pyrex washer support member 24. The next step is to metalize the bottom surface of washer 24 with an appropriate metal (I utilize titanium/tungsten-nickel-gold in the preferred embodiment utilizing an appropriate technique such as sputtering. Then, washer support member 24 is bonded to the ceramic base member 12 as described above. Then the periphery of the cover 40 (where it abuts shoulder 20) is metalized in the same way and similar material as the bottom of 24. Then the cover 40 is hermetically sealed to the shoulder 20 as described above.

One key advantage of my invention is that it provides a means a relatively isolating the silicon die from mechanical stresses, either developed within the housing or transmitted by the housing from external sources. Thus the support member 24 is a critical element in performing this function. Ideally the support element 24 would be very long in axial extent so as to provide a maximum of isolation from such stresses. However, to be practical (to avoid the housings from becoming too large) I have found a balance of interest and achievement of good results by having the axial length L of the washer or support member 24 (see FIG. 4) at least approximately twice as long as the thickness of the silicon die mounted thereon. For example, in an absolute pressure sensor application of the present invention, I have used a die having a nominal thickness of 10 mils with a tolerance of $+1$ and $-2$ so that the thickness could range over the range of 8-11 mils. Further, the washer or support member 24 has a nominal thickness of 20 mils with a tolerance of $+$ or $-1$ so that the washer could range in thickness in practice between 19 and 21 mils.

In addition, the washer-like support member has different characteristics dependent upon the size relationship between the die 30 and the support 24. To explain this, it is first helpful to assign the letter C to designate the length or side dimension of the square shaped die 30 shown in cross section in FIG. 1 and in plan view in FIG. 2. As the ratio between (C/B) is greater or lesser than approximately 0.85, then the transducer null shift (referring to the bridge comprising the piezoresistive elements) will change from a positive value to a negative value. Precisely, for a value which is greater than 0.85, a negative null shift will occur. When the ratio of (C/B) is less than approximately 0.85, then there will be a positive null shift.

Further, the ratio between the inside diameter A of the washer-like support member 24 to the outside diameter B, i.e., in releationship to the die with C also influences the transducer performance. As the ratio between (B/A) approaches infinity, extremely high null shifts are produced. The size relationship between the washer-like support member 24 and die 30 also impacts the transducer characteristics span over pressure. The ratio between (C/B) is an inverse function, i.e. when the ratio increases, the span shift (percent of full scale) decreases.

I have discussed above the various coefficients of thermal expansion of the components in the assembly, i.e., the die 30, the support 24, and the ceramic housing 12. I have found it essential, in the case of an absolute pressure transducer, to use the washer-like support 24 interposed between the housing 12 and the die 30. This permits, with the various designated thermal expansion coefficients, to permit the device to go through different ranges of temperatures without any adverse consequences to the hermetic seals. It has been found that if the die 30 were rigidly bonded directly to the ceramic housing 12, that, for the temperature expansion coefficience identified, that the hermetic seal would probably be broken, which would be disastrous for absolute pressure transducers and that the transducer performance perameters for temperature hysteresis, pressure hysteresis, null shift and span shift would not be achieved.

However, in a nonpressure transducer application consideration can be given to a support member that does not contain an aperture 25. In this case the support 24 would have a right circular cylindrical shape or other torus-like configuration.

While I have described a preferred embodiment of my invention, it will be understood that the invention is limited only by the scope of the following claims:

I claim:

1. A pressure transducer comprising:
   (a) a transducer housing including a ceramic base member having a recessed portion with an aperture therethrough and a shoulder portion around the periphery of said recessed portion;
   (b) a washer-like support member, having an outside diameter B, hermetically bonded on one face thereof to said base member with a central aperture in said support member being substantially in register with said aperture of said base member;
   (c) a silicon die having a flat shape, a length C, and a central portion of substantially reduced thickness so that said die is flexed in response to a pressure differential applied thereacross, the ratio of said length C to said diameter B being approximately 0.85;
   (d) means mounting said die to the other face of said support member, said mounting means functioning to hermetically seal said die to said support member and to position said portion of reduced thickness in register with said apertures; and
   (e) a cover member hermetically sealed to said shoulder portion.

2. Apparatus of claim 1 further characterized by said support member being of borosilicate glass and said support member and said silicon die being substantially the same coefficient of temperature expansion.

3. Apparatus of claim 1 further characterized by said support member being of silicon and said support member and said silicon die being substantially the same coefficient of temperature expansion.

4. Apparatus of claim 1 further characterized by the enclosed space between said cover member and said base member being drawn down to a vacuum prior to said cover member being hermetically sealed to said shoulder portion so said transducer may be utilized as an absolute pressure measuring means.

5. Apparatus of claim 1 further characterized by said support member having an axial length at least approximately twice the axial length of said die.

6. Apparatus of claim 1 characterized by said base member being of a ceramic of the class exemplified by 3M Company type ALSIMAG771.

7. Apparatus of claim 1 further characterized by said support member being made from a borosilicate glass.

8. Apparatus of claim 7 further characterized by said support member having an axial length at least approximately twice the axial length of said die.

9. Apparatus of claim 1 further characterized by said support member being made from a silicon.

10. A stress sensitive semiconductor unit and housing means for said die comprising:
    (a) a ceramic base member having a recessed portion and a shoulder portion around the periphery of said recessed portion;
    (b) a support member having an outside diameter B positioned within said recess and bonded on one face thereof to said base member with said support member having a central aperture;
    (c) a stress sensitive semiconductor die having a length C, the ratio of said length C to said diameter B being approximately 0.85;
    (d) means mounting said die to the other face of said support member, said mounting means functioning to bond said die to said support member with said die being positioned so that the center thereof is substantially in register with said aperture of said support member; and
    (e) cover means attached to said shoulder portion, whereby said support of said die on said support member functions to isolate said die from stresses within and transmitted by said base member.

11. A housing means for semiconductor devices said semiconductor devices, being formed in a semiconductor body having a length B, said housing means comprising:

a ceramic base member having an inner surface and an outer surface, said inner surface having a first portion thereof formed as a closed surface portion surrounding a base member passageway in said base member between said inner and said outer surfaces, said inner surface having a second portion thereof forming a closed surface portion between inner and outer boundaries such that those portions of said base member having said inner surface first portion are joined at said inner boundary of said inner surface second portion with those portions of said base member having said inner surface second portion, said inner surface second portion being adpated for bonding to a cover; and a cylindrical torus support means having an outside diameter C, the ratio of said length C to said diameter B being approximately 0.85 said support means having first and second end surfaces each formed as a closed surface portion and each surrounding a support means passageway in said support means between said first and second end surfaces, said second end surface being bonded to said inner surface first portion of said base member, said first end surface being adapted for bonding to a said semiconductor device, said cylindrical torus support means being formed of the material having a coefficient of a thermal expansion substantially identical to that of said semiconductor device.

* * * * *